United States Patent
Srinivasan et al.

(10) Patent No.: US 7,417,570 B2
(45) Date of Patent: Aug. 26, 2008

(54) LOSSLESS COMPARATIVE COMPRESSION AND TRANSMISSION METHOD AND SYSTEM

(75) Inventors: Sudarshan Lakshmipuram Srinivasan, Karnatka (IN); Luv Sharma, Uttar Pradesh (IN)

(73) Assignee: SAP AG, Walldorf (DE)

( * ) Notice: Subject to any disclaimer, the term of this patent is extended or adjusted under 35 U.S.C. 154(b) by 0 days.

(21) Appl. No.: 11/496,772

(22) Filed: Jul. 31, 2006

(65) Prior Publication Data

US 2008/0024350 A1    Jan. 31, 2008

(51) Int. Cl.
*H03M 7/30* (2006.01)
(52) U.S. Cl. .............................. 341/87; 341/51; 341/95
(58) Field of Classification Search ................... 341/87, 341/51
See application file for complete search history.

(56) References Cited

U.S. PATENT DOCUMENTS

| | | | | | |
|---|---|---|---|---|---|
| 4,412,306 | A | * | 10/1983 | Moll | 708/203 |
| 5,003,307 | A | * | 3/1991 | Whiting et al. | 341/51 |
| 5,150,430 | A | * | 9/1992 | Chu | 382/246 |
| 5,435,568 | A | * | 7/1995 | Black | 273/303 |
| 5,600,316 | A | * | 2/1997 | Moll | 341/87 |
| 5,771,010 | A | * | 6/1998 | Masenas | 341/51 |
| 5,874,908 | A | * | 2/1999 | Craft | 341/87 |
| 5,903,230 | A | * | 5/1999 | Masenas | 341/51 |
| 6,130,630 | A | * | 10/2000 | Grohs et al. | 341/51 |
| 6,144,658 | A | * | 11/2000 | Lebizay et al. | 370/352 |
| 6,320,522 | B1 | * | 11/2001 | Satoh | 341/51 |
| 6,359,574 | B1 | * | 3/2002 | Yariv | 341/50 |
| 6,573,847 | B1 | * | 6/2003 | Wang | 341/67 |

\* cited by examiner

*Primary Examiner*—Khai M Nguyen

(57) ABSTRACT

Data is compared with a reference data, which is accessible at a source. The data is then separated into a static part and a dynamic part, wherein the static part is common with the reference data and the dynamic part is not common with the reference data. The dynamic part is transmitted to a destination. At the destination, the dynamic part is merged with the static part, which is obtained from a copy of the data accessible at destination.

34 Claims, 7 Drawing Sheets

LOSSLESS COMPARATIVE COMPRESSION AND TRANSMISSION METHOD AND SYSTEM

FIELD OF THE INVENTION

This invention generally relates to data transmission. In particular, the invention relates to a method, apparatus and system to transfer large amounts of data over a communication medium.

DESCRIPTION OF THE RELATED ART

The Internet is a widely-used communication medium for transmitting data. However, transmitting several megabytes (MB) of data may cause heavy traffic on a HyperText Transfer Protocol (http) server, File Transfer Protocol (ftp) server, peer-to-peer client, internet server, Local Area Network (LAN) server and an e-mail server. Also, there may be a limit to the size of data a receiver can receive. For instance, if a recipient has a 5 MB limit on the size of a data store for an email "inbox", has already utilized 2 MB of the data store, and a sender tries to send an email with an attachment comprising 4 MB of data, the recipient will not be able to receive the data. Even if such data were able to be transmitted, it may strain the data delivery system.

Presently, there are many compression tools based on different compression algorithms that are used to compress data at a source and then transmit the compressed data. The transmitted compressed data is decompressed using the compression tool at a destination. But, even after compression, there are situations where the size of the compressed data is in the range of several megabytes (MBs) and the same problems as mentioned above can arise.

For example, in a distributed work environment, transmitting project development data among members of a development team can become a serious issue. Sending the project development data by email may not be possible because of the large size of the development data (on the order of tens of megabytes of data, or more). Even after compression using a compression tool, compressed development data may be on the order of megabytes of data, potentially resulting in difficulties transmitting the compressed development data.

One of the ways to share data is to store a copy of the data in a "shared" area on a server, for example, a HyperText Transfer Protocol (http) server, File Transfer Protocol (ftp) server, peer-to-peer client, internet server, LAN or email server. This is followed by sending an e-mail note referring to the location of the data in the shared area. However, using a server to store and to access the data may raise issues of performance (as the LAN servers are remotely located), security, memory requirements and operational costs.

SUMMARY OF THE INVENTION

According to an embodiment, a method comprises comparing data with a reference data accessible at a source; separating the data into a static part and a dynamic part, wherein the static part is common with the reference data and the dynamic part is not common with the reference data; and transmitting only the dynamic part to a destination.

BRIEF DESCRIPTION OF THE DRAWINGS

The embodiments of the invention, together with its advantages, may be best understood from the following detailed description taken in conjunction with the accompanying figures in which.

DETAILED DESCRIPTION

Figure 1:
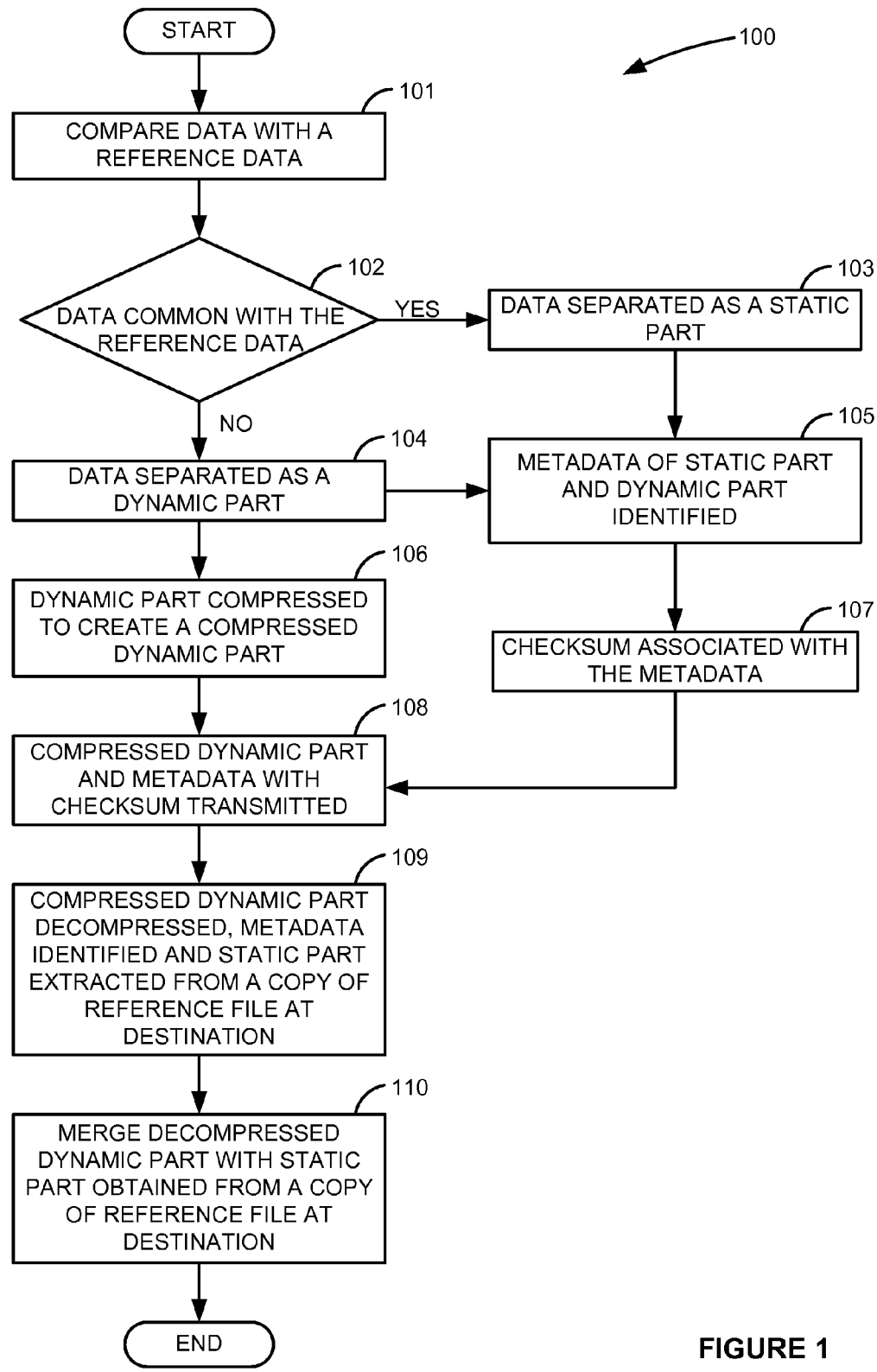
FIG. 1 illustrates flow of data according to one of the embodiments of the invention
Figure 2:
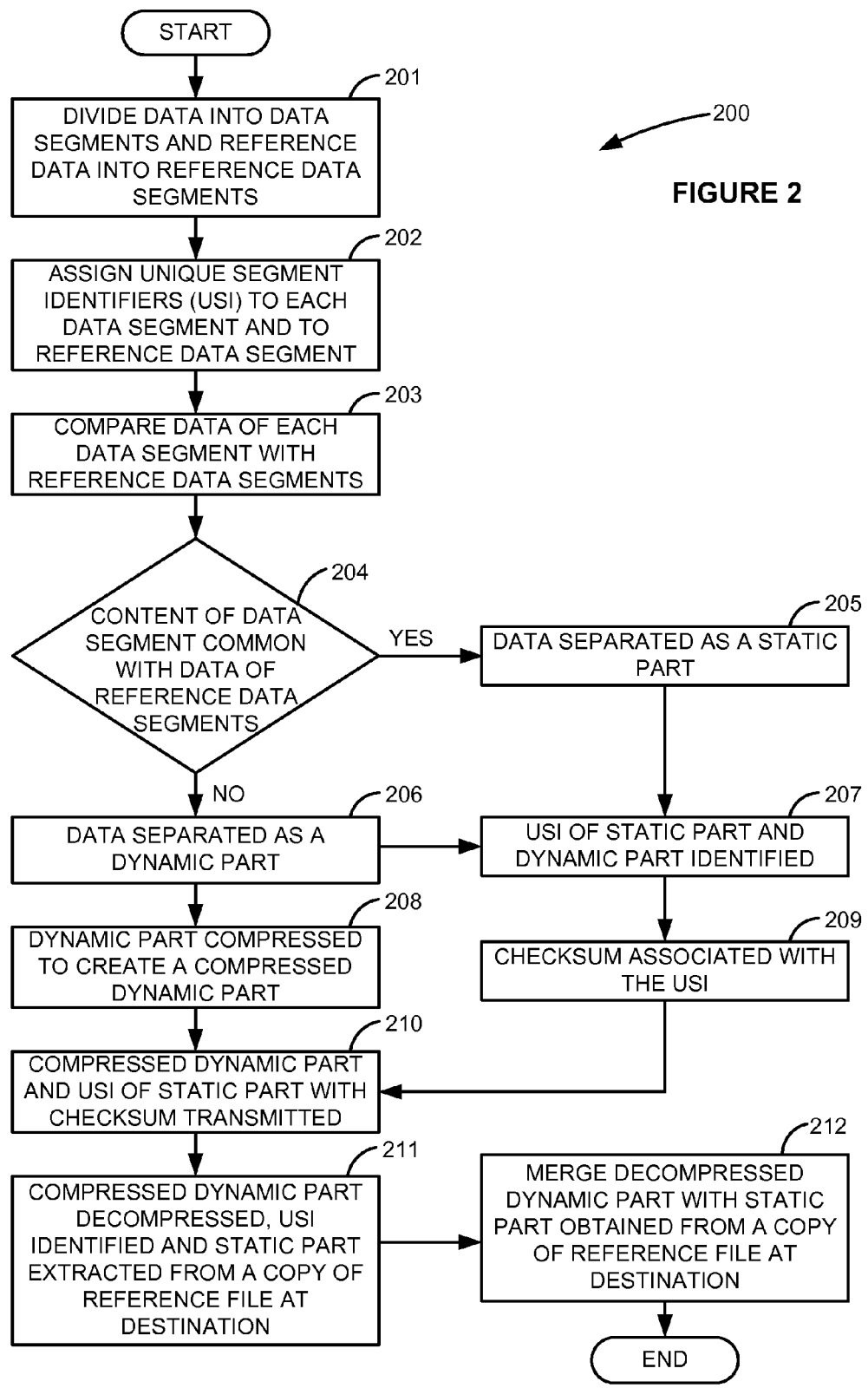
FIG. 2 shows a flow of data according to another embodiment of the invention

As shown in FIGS. 1 and 2, a method (100, 200) for transmitting data over a communication medium from a source to a destination is described. The method comprises comparing (101, 203) data with reference data accessible at the source. Based on whether the data is common with the reference data (102, 204), the data is separated into a static part (103, 205) and a dynamic part (104, 206), wherein the static part is common with the reference data and the dynamic part is not common with the reference data. Thereafter, the dynamic part is transmitted (108, 210) to the destination. The transmission may take place over a communication medium such as wired or wireless communication medium.

The source and the destination may each include a database or other data storing medium to store the reference data and the copy of reference data, respectively. Such databases or storing medium may be based on different data models, such as a flat model, hierarchical model, network model, relational model, dimensional model and object database model. The source and the destination may also include application servers having the reference data and the copy of the reference data linked to one of the applications respectively. The reference data at the source and the copy of the reference data at the destination may be accessed from the databases, other data storing medium, and applications, to compare the data at the source and to retrieve the static part at the destination.

The common data may include data which is identical with the reference data as well as data that is sufficiently similar to the reference data. For example, while a comparison may indicate the data and reference data are not identical, a threshold may be met or exceeded that indicates the data is sufficiently similar to the reference data for the data to be considered common to the reference data. The threshold may be decided by a comparator based on comparator algorithms.

In one embodiment of the invention, the reference data includes data that is common across different data of similar type and is common with most parts of the data to which it is to be compared. For example, in a user interface mock-up, the reference data may include portal framework details, user interface folders, themes, images and templates. This type of data is used often across different mock-ups and generally, is common across the different mock-ups. In another example, the reference data may include a most recent back up of the data, as may be provided by a backup utility. In other example, the reference data of an audio and video file may include bit rate, file format, encoding and decoding formats. The reference data for the audio and video file may also include identification tags comprising title, artist, track number, year of release, genre. Similarly, the reference data for digital books may include author information, year of publication, text format, audio formats, genre, edition information including abridged and unabridged information, title, bit rate, encoding and decoding formats. In general, common data may be based on various attributes that include, but are not limited to, name, type, location, size, creation data, last modified date, last accessed date, archive and index attribute, compression attributes, encryption attributes, permissions, owner, author, subject, revision number, application name used to access and execute the data (if applicable), category, keyword, comments and class/interface number.

In one embodiment of the invention, the dynamic data at the source is compressed to create a compressed dynamic part (106, 208). Compression at the source and decompression at the destination may utilize a lossless compression algorithm such as but not limited to Lempel-Ziv-Welch (LZW) data compression, block sorting lossless data compression, Moving Picture Experts Group (MPEG) compression, Huffman compression, Run Length Encoding compression, Lempel-Ziv-Oberhumer (LZO) real time data compression, Shannon-Fano compression, Apple lossless, direct stream transfer, free lossless audio codec, meridian lossless packing, true audio lossless, adaptive binary optimization, portable network graphics, Joint Photographic Expert Group (JPEG), Graphics Interchange Format (GIF), animation codec, Huffyuv compression, sheer video, and Moscow State University (MSU) Lossless video codec.

Thereafter, the compressed dynamic part is transmitted (108, 210) to the destination. The transmission takes place over a communication medium such as wired or wireless communication medium. At the destination, the compressed dynamic part is decompressed (109, 211). The compression as well as decompression is performed by a compression tool, which may include a copy of the reference data. The reference data need not be present in complete and expanded form. Well-known lossless compression algorithms may be applied to keep the size of this data and of the compression tool low. This data may be uncompressed or expanded during run-time. In case the compression and decompression tools are not used, the copy may also be stored at the destination. For example, if the tool is used to compress mock-ups, then the tool has a copy of a sample mock-up within itself as the reference data. Similarly, if the compression tool is used to compress audio files, then the compression tool has a copy of the audio file within itself as the reference data. A merge module may access the copy of the reference data stored in the compression tool or the destination to obtain the static part. The decompressed dynamic part is then merged (110, 212) with the static part, which is obtained from a copy of the reference data accessible at the destination, thus recreating the data at the destination.

As shown in FIG. 2, in one embodiment of the invention, comparing comprises dividing (201) the data into data segments and the reference data into reference data segments.

It may not be necessary that the segments be of the same size. The number and structure of the segments may differ depending upon the type of data. For example, if the data contains multiple folders, and if the probability of the data within a single folder being static is high, then every such folder may be considered as a segment. Mock-ups, which are usually full-sized scale models of a structure used for demonstration, study, or testing, may use this kind of uniform segment.

If the data generally is the same size and is well-segmented, then a segment could be well-defined blocks of the data. For example, if the data is a file and has several segments like 'header', 'contents', 'footer', 'chapter1', 'chapter2', 'glossary' etc, then these may be the segments.

If the data is well-structured, then a segment could be some well-defined parts of the data. For example, in an Extensible Markup Language (XML) file, certain tags and the information within the XML file could form certain segments.

Sometimes, if the data is unpredictable, such as in terms of size, segmentation, folders, contents in the folder, data structure, kind of data found in a specific data field, etc., then the number and structure of these segments may be decided at run-time as well. However, the destination may be provided with a definition of segments.

Further in FIG. 2, a unique segment identifier (USI) is assigned (202) to each data segment and each reference data segment. Then, the content of each data segment is compared (203) to the content of each reference data segments, until a match is found, that is, until a reference data segment is identified whose content is in common with the data segment content. A data segment, whose content is common with a reference data segment, is classified as static (205). The USIs of the reference data segments corresponding to the static data segments are identified. A data segment, whose content is not common with a reference data segment is classified as a dynamic part (207).

Comparing may also utilize comparison algorithms that perform a byte-by-byte comparison, string comparison, convert the data into data images and the reference data into reference data images and then compare the data images to the reference data images, and block comparison using a bitwise Boolean exclusive-or operation.

The comparison between the segments of the data and the reference data result in one of the following:

The segments of the data and the reference data are not common or dissimilar. Such segments of the data are classified as a dynamic part; or The segments of the data and the reference data are identical. Such segments of the data are common and are classified as a static part; or While a comparison indicates the data and reference data are not identical, if a threshold is met or exceeded that indicates the segments are sufficiently similar to be considered common, the data is classified as a static part.

Therefore, the static part may include the segments of the data that are identical with segments of the reference data as well as the segments of the data that are sufficiently similar to the segments of the reference data.

As shown in FIG. 1, in one embodiment of the invention, metadata of the data is identified (105). The metadata may be a data type, data name, date of creation, date of modification, version, size, folder location and data name pattern. In an alternative embodiment, only metadata of the static part with associated checksum may be transmitted. In one embodiment, the metadata includes information about both the static part as well as the dynamic part. A checksum may be associated (107) with the metadata to protect integrity of the metadata, by detecting errors in the metadata. The metadata and associated checksum of the data are then transmitted (108) over a communication medium.

The metadata identifies (109) the static part and is used to obtain the static part from a copy of the reference file accessible at the destination. The identified static part is then merged (110) with the transmitted dynamic part at the destination.

As shown in FIG. 2, the USI of each reference data segment corresponding to the static part of the data segments as well as USI of the dynamic part of the data segment is identified. A checksum may be associated (209) with the identified USI to protect integrity of the identified USI, by detecting errors in the identified USI. The identified USI and associated checksum may be transmitted (210) over the communication medium. In an alternative embodiment, only the USI of each reference data segment corresponding to the static part of the data segments with associated checksum may be transmitted.

The transmitted USI identifies (211) the static part and is used to obtain the static part from a copy of the reference file accessible at the destination. The identified static part is then merged (212) with the transmitted dynamic part at the destination.

As a practical example, user interface designers use a generic What You See is What You Get (WYSWYG) based Integrated Development Environment (IDE) to create screen user interface mock-ups including HyperText Markup Language (HTML) mock-ups or Flash-based mock-ups. This invention may be applied in transmitting such mock-up data.

The mock-ups data typically contain two types of data. One type of data, which is common across all mock-ups, may be classified as the static part. The other type of data, which is specific to a particular mock-up, may be classified as the dynamic part. Typically, the static part of the mock-ups includes portal framework details, user interface folder and themes. Similarly, dynamic part in the mock-ups includes application specific files and images. The mock-ups generally include 20 MB or more of data. Transmitting mock-up data may unnecessarily burden the system and/or communication resources.

The burden in transmitting the mock-up data can be lessened by separating the mock-up data into two parts, namely the static part and the dynamic part. Thereafter, the dynamic part may be compressed by a compression tool and transmitted over a communication medium. Metadata of the mock up data is transmitted as well, in one embodiment of the invention. At the destination, the compressed dynamic part is decompressed using the compression tool. Using metadata, the static part of the data is retrieved from a copy of the data at the destination. The decompressed dynamic part and the retrieved static part are merged to obtain the data at the destination.

The invention may be applied as a tool in backing up data, for example, an incremental back up utility. In such an embodiment, data is broken down into two classes such as system data and user data. System data makes up the operating system and its extensions. This data is to be kept in the system file systems, namely/(root), /usr, /tmp, /var, and so on. The user data is typically local data that individuals need to complete their specific tasks. This data is to be kept in the/ home file system or in file systems that are created specifically for user data.

Comparing the latest system data and user data with the most recent back up allows separating the incremental change in data. The incremental change is identified as the dynamic part and is transmitted as incremental back up. At the destination, the transmitted dynamic part is merged with the most recent back up. User data tends to change much more often than operating system data. Therefore, a large portion of the dynamic part represents change in the user data. As backup images of the user data is much smaller than the system data, the back up process is faster.

In other examples, the method may be utilized to compare and to transmit a dynamic part of text files, a folder, or zip archives. Furthermore, the invention may be used to update websites, update presentation and document files, update image files (based on comparison and separation of the dynamic part based on pixels), compare and update file directories, merge code changes, and compare program output.

In yet other examples, the invention may also be used to compare two audio/video files to see if the two audio/video files are the same. If there is any variation in the two audio/video files, the part of the audio/video file which is not common with the other may be identified as a dynamic part and may be transmitted. In this situation, apart from transmitting the dynamic part to a recipient, transmitting the dynamic part of the video/audio file may also include both downloading from a source as well as uploading to a common source.

Figure 3:
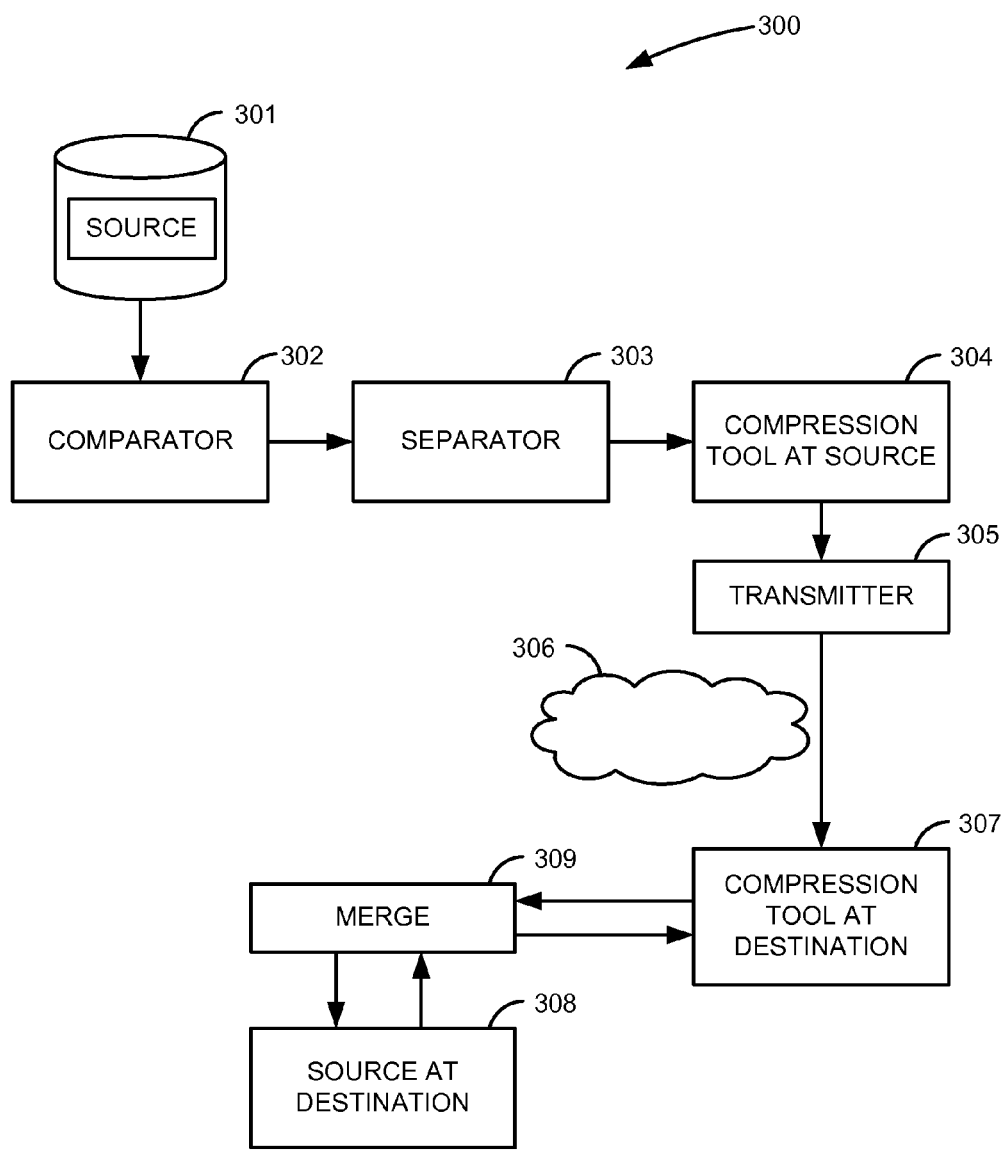
FIG. 3 illustrates a system, according to an implementation of the invention

FIG. 3 shows a system (300), according to an implementation of the invention, for transmitting data over a communication medium (306). The system comprises a source (301) to provide access to a reference data. A comparator (302) is communicatively coupled to the source, wherein the comparator compares data with the reference data. A separator (303), communicatively coupled to the comparator, separates the data into a static part and a dynamic part, wherein the static part is common with the reference data and the dynamic part is not common with the reference data. A transmitter (305) transmits the dynamic part to a destination.

In one embodiment, the system further includes a compression tool (304) to compress the dynamic part to create a compressed dynamic part at the source. The compression tool may utilize a compression algorithm such as described above. The compressed dynamic part is transmitted over the communication medium to the destination. A similar compression tool (307) is provided at the destination to decompress the transmitted compressed dynamic part at the destination.

The compression tool may include the copy of the reference data. This data need not be present in complete and expanded form. Well-known lossless compression algorithms may be applied to keep the size of this data and of the compression tool low. This data may be uncompressed or expanded during run-time. For example, if the tool is used to compress mock-ups, then the tool has a copy of the mock-up within itself as the reference data. Similarly, if the compression tool is used to compress audio files, then it has a copy of the audio file within itself as the reference data.

The system further comprises a merge module (309), which merges the dynamic part with the static part obtained from a copy of the reference data, which is accessible at the destination.

The transmitter (305) may further transmit metadata of the data. The metadata may include metadata of both the static part and the dynamic part. A checksum may be associated with the metadata to protect integrity of the metadata. The transmitter may also transmit checksum associated with the data. In an alternative embodiment, the transmitter may only transmit metadata of the static part with associated checksum.

The merge module (309) may utilize the metadata to identify the static part and is used obtain the static part from a copy of the reference file accessible at the destination. The merge module then merges (110) the identified static part with the transmitted dynamic part at the destination.

Figure 4:
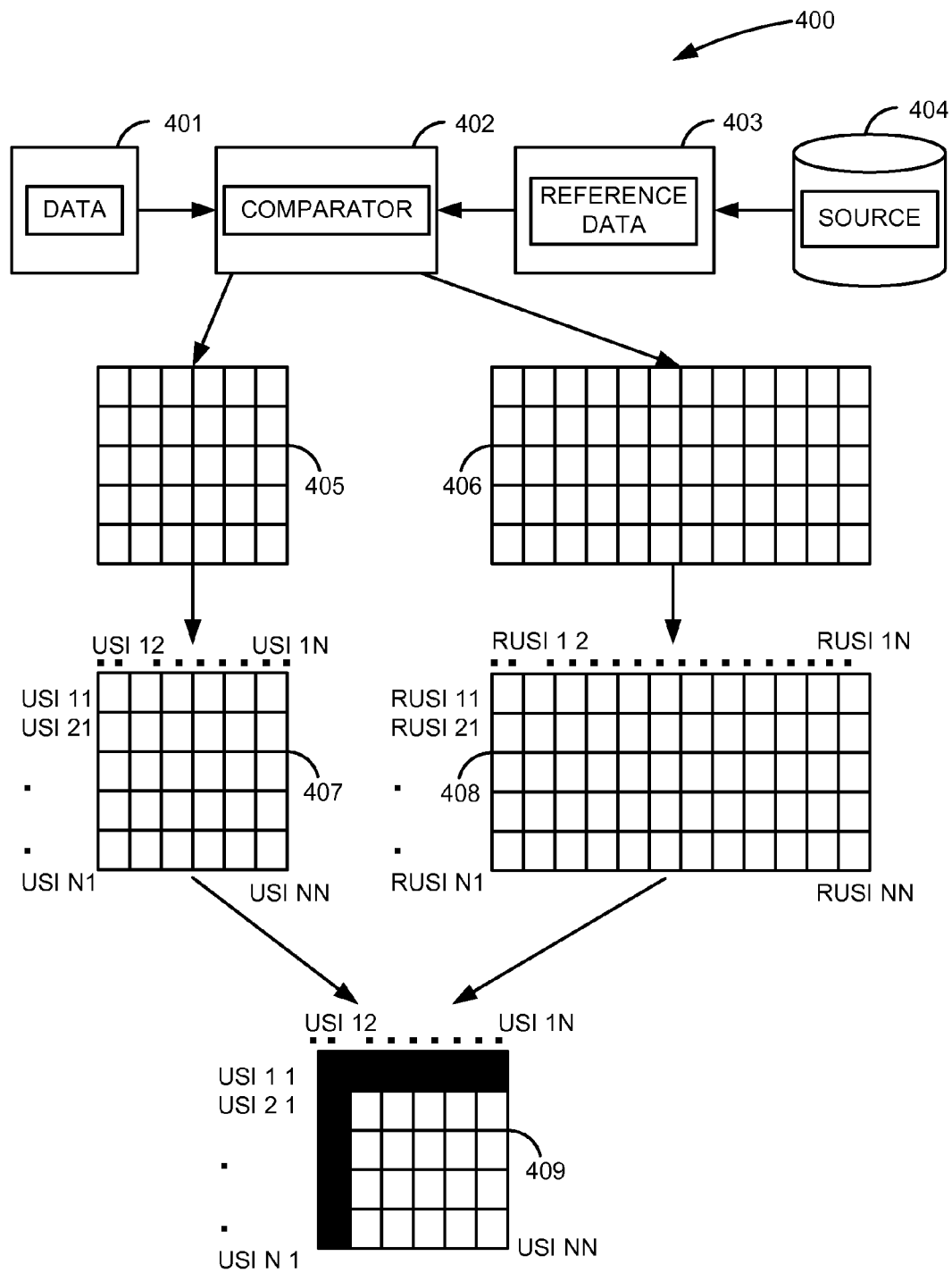
FIG. 4 illustrates a comparator utilized to compare data, according to an implementation of the invention

As shown in FIG. 4, the comparator (402) compares the data (401) with reference data (403) accessed from a source (404). The comparator then divides the data into data segments (405) and the reference data into reference data segments (406). The data and the reference data may be divided into a segmented matrix.

The comparator further assigns a Unique Segment Identifier (USI) to each segment of the data segment and reference data segment, as shown in (407) and (408). For example, "USI mn" indicates the USI for the data segment, wherein m is the row number and n is the column number. Similarly, "RUSI mn" indicates USI for the reference data segment, wherein m is the row number and n is the column number.

The comparator further compares each data segment to reference data segments. A data segment, whose content is common with a reference data segment, is classified as static (205). The USIs of the reference data segments corresponding to the data segments that are identified as static are identified. A data segment, whose content is not common with a reference data segment, is identified as a dynamic part (206). For example, as shown in (409) if data represented by unique segment identifier (USI 11 to USIn1) and (USI 11 to USI 1n) is identified as data not common with the reference data, it is identified as dynamic part (marked in black). The data represented by USI matrix USI 22-USI n2-USI nn-USI 2n is identified as the static part of the data.

Figure 5:
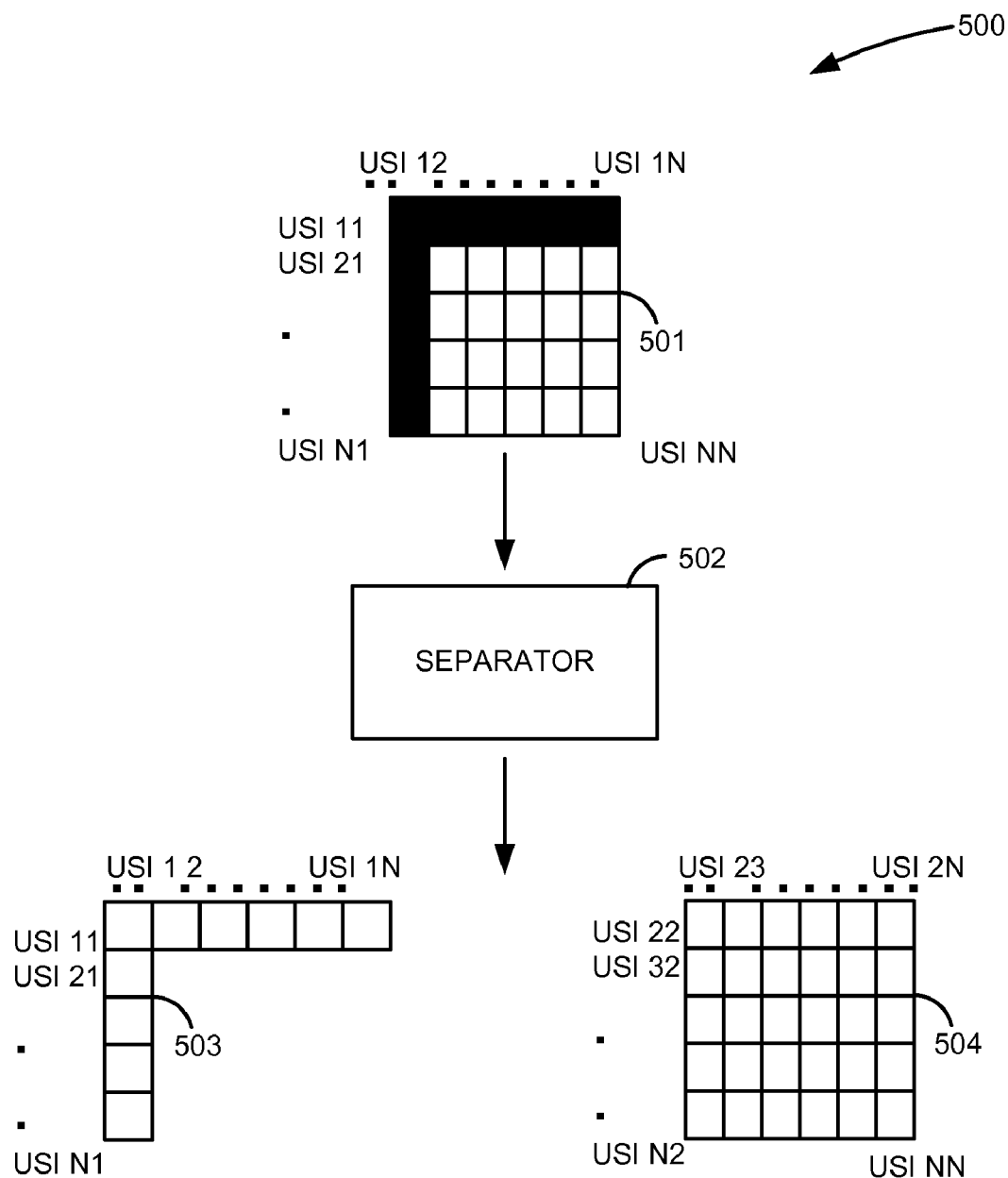
FIG. 5 illustrates a separator utilized to separate data, according to an implementation of the invention

As shown in FIG. 5, the separator (502) receives, from the comparator, data (501) with an identified static part and a dynamic part. The separator separates the data into the dynamic part (503) and the static part (504).

Figure 6:
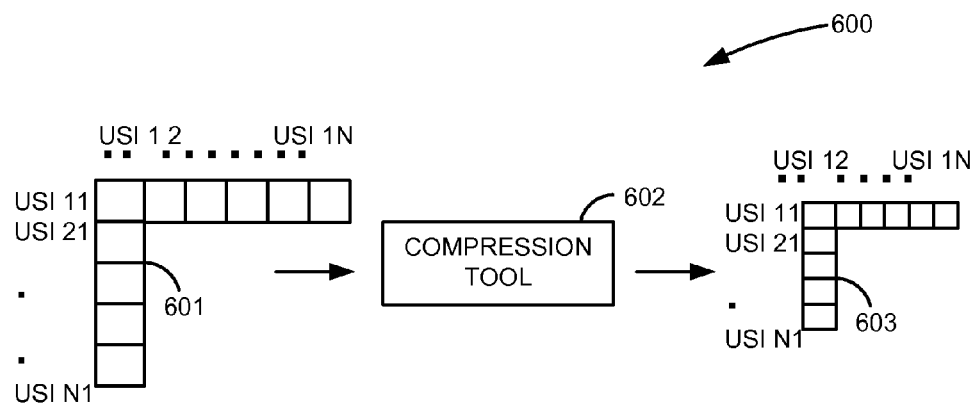
FIG. 6 illustrates a compression tool utilized to compress data at source, according to an implementation of the invention

As shown in FIG. 6, the system may further include a compression tool (602). The compression tool compresses the dynamic part (601), as received from the separator, into a compressed dynamic part (603). The compression tool may utilize a compression algorithm such as described above.

The transmitter (305) further transmits the compressed dynamic part over a communication medium (306) to a destination, wherein the communication medium may be either a wired or wireless communication medium, or combination thereof.

Figure 7:
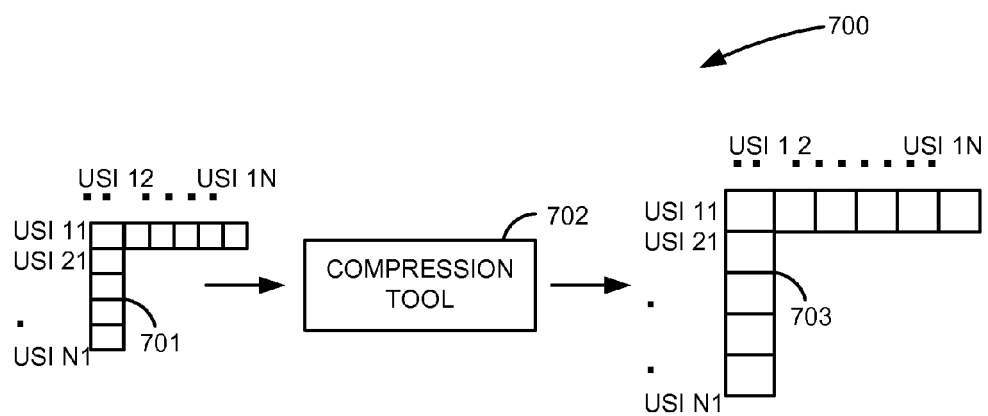
FIG. 7 illustrates a compression tool utilized to decompress data at destination, according to an implementation of the invention

At the destination, as shown in FIG. 7, the compressed dynamic part (701) is decompressed by a compression tool (702) into the dynamic part. The compression tool may utilize a compression algorithm such as described above.

Figure 8:
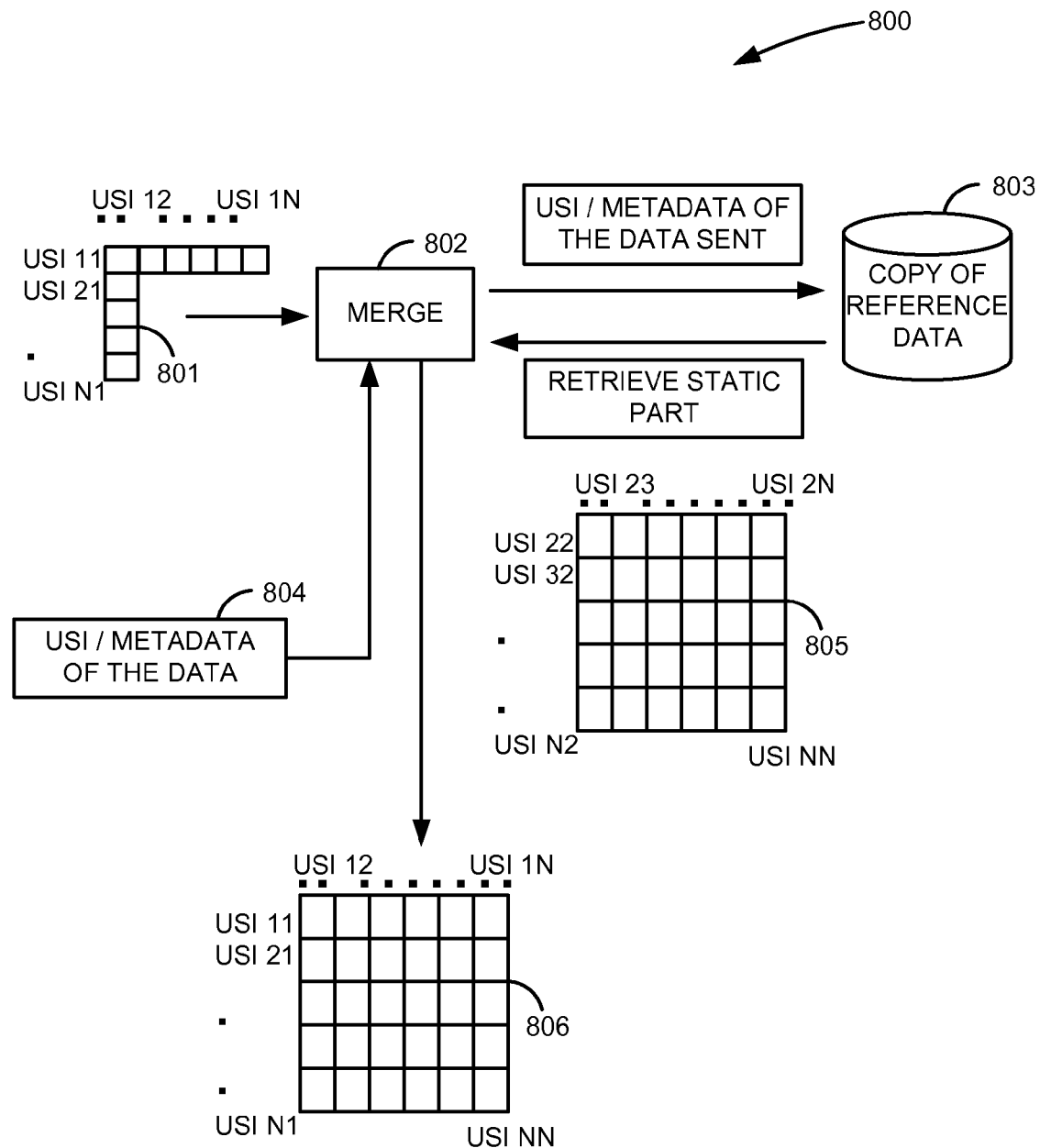
FIG. 8 illustrates merge module at destination according to an implementation of the invention

As shown in FIGS. 3 and 8, the transmitter (305) may transmit the USIs of the reference data segments corresponding to the static part with a checksum associated with the transmitted USIs. The checksum protects integrity of the unique segment identifiers. The merge module (802) may utilize USIs and checksum (804) to identify the static part and obtain the static part from a copy of the data (803) accessible at the destination. The merge module merges the retrieved static part (805) with the decompressed dynamic part (801) to obtain the data (806) at the destination.

Other embodiments of the invention may be implemented in digital electronic circuitry, or in computer hardware, firmware, software, or in combinations of them.

Elements of the invention may also be provided as a machine-readable medium for storing the machine-executable instructions. The machine-readable medium may include, but is not limited to, Flash memory, optical disks, CD-ROMs, DVD ROMs, RAMs, EPROMs, EEPROMs, magnetic or optical cards, propagation media or other type of machine-readable media suitable for storing electronic instructions.

Throughout the foregoing description, for the purposes of explanation, numerous specific details were set forth in order to provide a thorough understanding of the invention. It will be apparent, however, to one skilled in the art that the invention may be practiced without some of these specific details. The underlying principles of the invention may be employed using a virtually unlimited number of different types of input data and associated actions.

Accordingly, the scope and spirit of the invention should be judged in terms of the claims which follow.

What is claimed is:

1. A method comprising:
    dividing data into data segments;
    dividing a reference data accessible at a source into reference data segments;
    assigning a unique segment identifier to each data segment and reference data segment;
    comparing the data with the reference data by comparing each data segment with the reference data segments;
    separating the data into a static part and a dynamic part, wherein the static part is common with the reference data and the dynamic part is not common with the reference data; and
    transmitting the dynamic part to a destination.

2. The method of claim 1, further comprising compressing the dynamic part at the source to create a compressed dynamic part, and wherein transmitting comprises transmitting the compressed dynamic part to the destination.

3. The method of claim 2, further comprising decompressing the compressed dynamic part at the destination.

4. The method of claim 3, further comprising merging the dynamic part with the static part obtained from a copy of the reference data accessible at the destination.

5. The method of claim 2, wherein compressing utilizes a compression algorithm selected from a group consisting of Lempel-Ziv-Welch (LZW) data compression, block sorting lossless data compression, Moving Picture Experts Group (MPEG) compression, Huffman compression, Run Length Encoding compression, Lempel-Ziv-Oberhumer (LZO) real time data compression, Shannon-Fano compression, Apple lossless, direct stream transfer, free lossless audio codec, meridian lossless packing, true audio lossless, adaptive binary optimization, portable network graphics, Joint Photographic Expert Group (JPEG), Graphics Interchange Format (GIF), animation codec, Huffyuv compression, sheer video, and Moscow State University (MSU) Lossless video codec.

6. The method of claim 1, further comprising:
    transmitting the unique segment identifiers of the reference data segment corresponding to the static part with a checksum to protect integrity of the transmitted unique segment identifiers;
    identifying the static part in a copy of the reference data accessible at the destination using the transmitted unique segment identifiers; and
    merging the identified static part with the transmitted dynamic part at the destination.

7. The method of claim 1, wherein comparing is selected from a group consisting of:
    byte-by-byte comparison;
    string comparison;
    converting the data into data images and the reference data into reference data images and comparing the data images to the reference data images; and
    block comparison using a bitwise Boolean exclusive-or operation.

8. The method of claim 1, further comprising transmitting metadata of the data.

9. The method of claim 8, wherein the metadata is selected from a group consisting of data type, data name, date of creation, date of modification, version, size, folder location and data name pattern.

10. The method of claim 8, wherein the metadata includes a checksum to protect integrity of the metadata.

11. The method of claim 1, wherein transmitting comprises transmitting over a communication medium selected from a group consisting of a wired and wireless communication medium.

12. The method of claim 8, wherein the metadata:
    identifies the static part in a copy of the reference data accessible at the destination; and wherein the identified static part is merged with the transmitted dynamic part at the destination.

13. An article of manufacture, comprising:
a machine readable medium that provides instructions, which when executed by a machine, causes the machine to:
divide data into data segments;
divide a reference data accessible at a source into reference data segments;
assign a unique segment identifier to each data segment and reference data segment;
compare the data with the reference data by comparing each data segment with the reference data segments;
separate the data into a static part and a dynamic part, wherein the static part is common with the reference data and the dynamic part is not common with the reference data; and
transmit the dynamic part to a destination.

14. The medium of claim 13, wherein the machine readable medium provides instructions, which when executed by a machine, causes the machine to compress the dynamic part at the source to create a compressed dynamic part.

15. The medium of claim 14, wherein the machine readable medium provides instructions, which when executed by a machine, causes the machine to transmit the compressed dynamic part to the destination.

16. The medium of claim 15, wherein the machine readable medium provides instructions, which when executed by a machine, causes the machine to decompress the compressed dynamic part at the destination.

17. The medium of claim 16, wherein the machine readable medium provides instructions, which when executed by a machine, causes the machine to merge the dynamic part with the static part obtained from a copy of the reference data accessible at the destination.

18. The medium of claim 14, wherein the machine readable medium provides instructions, which when executed by a machine, causes the machine to utilize a compression algorithm selected from a group consisting of Lempel-Ziv-Welch (LZW) data compression, block sorting lossless data compression, Moving Picture Experts Group (MPEG) compression, Huffman compression, Run Length Encoding compression, Lempel-Ziv-Oberhumer (LZO) real time data compression, Shannon-Fano compression, Apple lossless, direct stream transfer, free lossless audio codec, meridian lossless packing, true audio lossless, adaptive binary optimization, portable network graphics, Joint Photographic Expert Group (JPEG), Graphics Interchange Format (GIF), animation codec, Huffyuv compression, sheer video, and Moscow State University (MSU) Lossless video codec.

19. The medium of claim 13, wherein the machine readable medium provides instructions, which when executed by a machine, causes the machine to:
transmit the unique segment identifiers of the reference data segment corresponding to the static part with a checksum to protect integrity of the transmitted unique segment identifiers;
identify the static part in a copy of the reference data accessible at the destination using the transmitted unique segment identifiers; and
merge the identified static part with the transmitted dynamic part at the destination.

20. The medium of claim 13, wherein the machine readable medium provides instructions, which when executed by a machine, causes the machine to transmit metadata of the data.

21. The medium of claim 20, wherein the machine readable medium provides instructions, which when executed by a machine, causes the machine to include the metadata selected from a group consisting of data type, data name, date of creation, date of modification, version, size, folder locations and data name pattern.

22. The medium of claim 20, wherein the machine readable medium provides instructions, which when executed by a machine, causes the machine to include a checksum in the metadata to protect integrity of the metadata.

23. The medium of claim 20, wherein the machine readable medium provides instructions, which when executed by a machine, causes the machine to utilize the metadata to:
identify the static part in a copy of the reference data accessible at the destination; and
merge the identified static part with the transmitted dynamic part at the destination.

24. A system, comprising:
a source to provide access to a reference data;
a comparator communicatively coupled to the source, to
divide data into data segments;
divide a reference data accessible at a source into reference data segments;
assign a unique segment identifier to each data segment and reference data segment; and
compare data with the reference data;
a separator to separate the data into a static part and a dynamic part, wherein the static part is common with the reference data and the dynamic part is not common with the reference data; and
a transmitter to transmit the dynamic part to a destination.

25. The system of claim 24, further comprising:
a compression tool to:
compress the dynamic part to create a compressed dynamic part at the source, and
wherein transmitting comprises transmitting the compressed dynamic part to the destination; and
decompress the compressed dynamic part at the destination.

26. The system of claim 25, further comprising a merge module to merge the dynamic part with the static part obtained from a copy of the reference data accessible at the destination.

27. The system of claim 26, wherein the merge module:
identifies the static part in the copy of the reference data accessible at the destination using the metadata; and
merges the identified static part with the transmitted dynamic part at the destination.

28. The system of claim 25, wherein the compression tool utilizes a compression algorithm selected from a group of Lempel-Ziv-Welch (LZW) data compression, block sorting lossless data compression, Moving Picture Experts Group (MPEG) compression, huffman compression, Run Length Encoding compression, Lempel-Ziv-Oberhumer (LZO) real time data compression, shannon-fano compression, apple lossless, direct stream transfer, free lossless audio codec, meridian lossless packing, true audio lossless, adaptive binary optimization, portable network graphics, Joint Photographic Expert Group (JPEG), Graphics Interchange Format (GIF), animation codec, huffyuv, sheer video, Moscow State University (MSU) Lossless video codec.

29. The system of claim 24, further comprising
the transmitter to transmit the unique segment identifiers of the reference data segment corresponding to the static part with a checksum to protect integrity of the transmitted unique segment identifiers;
the merge module to identify the static part in a copy of the reference data accessible at the destination using the transmitted unique segment identifiers; and the merge module to merge the identified static part with the transmitted dynamic part at the destination.

30. The system of claim 24, wherein the comparator utilizes a comparing algorithm selected from a group consisting of:
- byte-by-byte comparison;
- string companson;
- converting the data into data images and the reference data into reference data images and comparing the data images to the reference data images; and
- block comparison using a bitwise Boolean exclusive-or operation.

31. The system of claim 24, further comprising the transmitter to transmit metadata of the data.

32. The system of claim 31, wherein the metadata is selected from a group consisting of data type, data name, date of creation, date of modification, version, size, folder location and data name pattern.

33. The system of claim 31, wherein the metadata includes a checksum to protect integrity of the metadata.

34. The system of claim 24, wherein the transmitter transmits over a communication medium selected from a group consisting of a wired and wireless communication medium.

* * * * *